(12) United States Patent
Zonnevylle et al.

(10) Patent No.: US 9,607,806 B2
(45) Date of Patent: Mar. 28, 2017

(54) CHARGED PARTICLE MULTI-BEAM APPARATUS INCLUDING A MANIPULATOR DEVICE FOR MANIPULATION OF ONE OR MORE CHARGED PARTICLE BEAMS

(75) Inventors: Aernout Christiaan Zonnevylle, Utrecht (NL); Pieter Kruit, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 13/484,231

(22) Filed: May 30, 2012

(65) Prior Publication Data
US 2012/0305798 A1 Dec. 6, 2012

(30) Foreign Application Priority Data
May 30, 2011 (NL) ..................................... 2006868

(51) Int. Cl.
*G21K 1/08* (2006.01)
*H01J 37/30* (2006.01)
(Continued)

(52) U.S. Cl.
CPC .......... *H01J 37/3007* (2013.01); *B82Y 10/00* (2013.01); *B82Y 40/00* (2013.01); *H01J 37/3174* (2013.01);
(Continued)

(58) Field of Classification Search
CPC .......... H01J 37/00; H01J 37/02; H01J 37/023; H01J 37/147
(Continued)

(56) References Cited

U.S. PATENT DOCUMENTS

| 4,939,371 A | 7/1990 | Goto |
| 5,117,117 A | 5/1992 | Oae et al. |

(Continued)

FOREIGN PATENT DOCUMENTS

| CN | 1172973 A | 2/1998 |
| CN | 1372290 A | 10/2002 |

(Continued)

OTHER PUBLICATIONS

Berry, I.L., et al. "Programmable Aperture Plate for Maskless High-Throughput Nanolithography." J. Vac. Sci. Technol. B 15(6), pp. 2832-2836. Melville, New York (1997). 6 pages.
(Continued)

*Primary Examiner* — Jason McCormack
(74) *Attorney, Agent, or Firm* — Blakely Sokoloff Taylor & Zafman LLP

(57) ABSTRACT

The invention relates to a method and a device for manipulation of one or more charged particle beams of a plurality of charged particle beamlets in a charged particle multi-beamlet apparatus. The manipulator device comprises a planar substrate comprising an array of through openings in the plane of the substrate, each of these through openings is arranged for passing the at least one charged particle beamlet there through, wherein each of the through openings is provided with one or more electrodes arranged around the through opening, and a electronic control circuit for providing control signals to the one or more electrodes of each through opening, wherein the electronic control circuit is arranged for providing the one or more electrodes of each individual through opening with an at least substantially analog adjustable voltage.

40 Claims, 7 Drawing Sheets

(51) Int. Cl.
*H01J 37/317* (2006.01)
*B82Y 10/00* (2011.01)
*B82Y 40/00* (2011.01)

(52) U.S. Cl.
CPC ... *H01J 37/3177* (2013.01); *H01J 2237/0435* (2013.01); *H01J 2237/04924* (2013.01); *H01J 2237/1205* (2013.01); *H01J 2237/15* (2013.01); *H01J 2237/1532* (2013.01)

(58) Field of Classification Search
USPC ...... 250/306, 307, 311, 396 R, 492.3, 492.1, 250/492.2
See application file for complete search history.

(56) References Cited

U.S. PATENT DOCUMENTS

| | | | |
|---|---|---|---|
| 5,144,142 A * | 9/1992 | Fueki et al. | 250/396 R |
| 5,245,194 A | 9/1993 | Oae et al. | |
| 5,401,974 A * | 3/1995 | Oae et al. | 250/492.2 |
| 5,617,129 A | 4/1997 | Chizuk, Jr. et al. | |
| 5,834,783 A | 11/1998 | Muraki et al. | |
| 5,962,859 A | 10/1999 | Groves et al. | |
| 5,981,962 A | 11/1999 | Groves et al. | |
| 6,014,200 A | 1/2000 | Sogard et al. | |
| 6,127,775 A | 10/2000 | Bergen | |
| 6,175,122 B1 | 1/2001 | Groves et al. | |
| 6,465,795 B1 | 10/2002 | Madonado et al. | |
| 6,483,120 B1 | 11/2002 | Yui et al. | |
| 6,563,124 B2 | 5/2003 | Veneklasen et al. | |
| 6,617,595 B1 | 9/2003 | Okunuki | |
| 6,646,275 B2 * | 11/2003 | Oae | B82Y 10/00 250/398 |
| 6,703,629 B2 | 3/2004 | Nakasugi | |
| 7,868,300 B2 * | 1/2011 | Kruit et al. | 250/397 |
| 2001/0028044 A1 | 10/2001 | Hamaguchi et al. | |
| 2001/0028046 A1 | 10/2001 | Hamaguchi et al. | |
| 2002/0028399 A1 | 3/2002 | Nakasuji et al. | |
| 2002/0038853 A1* | 4/2002 | Hamaguchi et al. | 250/492.3 |
| 2002/0134912 A1 | 9/2002 | Veneklasen et al. | |
| 2003/0189180 A1* | 10/2003 | Hamaguchi | B82Y 10/00 250/492.3 |
| 2003/0209673 A1 | 11/2003 | Ono et al. | |
| 2004/0169147 A1 | 9/2004 | Ono et al. | |
| 2005/0023486 A1* | 2/2005 | Takakuwa | B82Y 10/00 250/492.2 |
| 2005/0133739 A1* | 6/2005 | Ogasawara | B82Y 10/00 250/492.22 |
| 2005/0211921 A1* | 9/2005 | Wieland | B82Y 10/00 250/492.2 |
| 2005/0242303 A1 | 11/2005 | Platzgummer | |
| 2005/0269528 A1 | 12/2005 | Kruit | |
| 2006/0060775 A1* | 3/2006 | Sakakibara | B82Y 10/00 250/307 |
| 2007/0023654 A1* | 2/2007 | Kamimura et al. | 250/310 |
| 2007/0194235 A1* | 8/2007 | Kimba et al. | 250/310 |
| 2009/0114837 A1* | 5/2009 | Grella et al. | 250/396 R |
| 2009/0140160 A1* | 6/2009 | Platzgummer et al. | 250/396 R |
| 2009/0146082 A1* | 6/2009 | Stengl | B82Y 10/00 250/492.22 |
| 2009/0212229 A1 | 8/2009 | Wieland et al. | |
| 2009/0230316 A1* | 9/2009 | Goto | 250/396 R |
| 2010/0065741 A1* | 3/2010 | Gerthsen et al. | 250/311 |
| 2010/0276606 A1 | 11/2010 | Baars et al. | |
| 2011/0204253 A1* | 8/2011 | Platzgummer et al. | 250/396 R |
| 2011/0216299 A1* | 9/2011 | Steenbrink | B82Y 10/00 355/67 |
| 2011/0266418 A1* | 11/2011 | Wieland | B82Y 10/00 250/208.2 |
| 2012/0065741 A1* | 3/2012 | Chang et al. | 623/23.72 |
| 2012/0091318 A1* | 4/2012 | Wieland | B82Y 10/00 250/208.2 |
| 2012/0091358 A1* | 4/2012 | Wieland et al. | 250/396 R |

FOREIGN PATENT DOCUMENTS

| | | |
|---|---|---|
| CN | 101019203 | 8/2007 |
| EP | 1 441 381 A2 | 7/2004 |
| GB | 2 340 991 A | 3/2000 |
| GB | 2349737 A | 11/2000 |
| JP | 62-088247 | 4/1987 |
| JP | S63173326 A | 7/1988 |
| JP | 04-053222 | 2/1992 |
| JP | 4-328236 | 11/1992 |
| JP | 05-251315 A | 9/1993 |
| JP | H09330870 | 12/1997 |
| JP | H11265071 | 9/1999 |
| JP | H11273603 | 10/1999 |
| JP | 11-317357 | 11/1999 |
| JP | 2000-115428 | 4/2000 |
| JP | 200115428 A | 1/2001 |
| JP | 2001118491 | 4/2001 |
| JP | 2001-345259 A | 12/2001 |
| JP | 2004-165076 A | 6/2004 |
| JP | 2004165076 | 6/2004 |
| JP | 2004282038 | 10/2004 |
| JP | 2005136114 | 5/2005 |
| JP | 2006019438 | 1/2006 |
| JP | 2007505332 | 3/2007 |
| JP | 4401614 | 11/2009 |
| JP | 4401614 | 1/2010 |
| JP | 2011517131 | 11/2013 |
| RU | 113611 | 2/2012 |
| TW | 200952022 | 12/2009 |
| TW | 201103066 A1 | 1/2011 |
| WO | WO 01/75948 A1 | 10/2001 |
| WO | WO 02/01596 A1 | 1/2002 |
| WO | WO-2005010618 | 2/2005 |
| WO | WO 2009/127659 | 10/2009 |
| WO | WO-2009127658 | 10/2009 |
| WO | WO-2010094719 | 8/2010 |
| WO | WO 2010/134026 A2 | 11/2010 |
| WO | WO 2011/043657 A2 | 4/2011 |
| WO | WO 2011/051301 A1 | 5/2011 |
| WO | WO 2012/041464 A1 | 4/2012 |

OTHER PUBLICATIONS

Van Himbergen, H.M.P., et al., "High Throughput Defect Detection with Multiple Parallel Electron Beams," *J. Vac. Sci. Technol. B.*, vol. 25, No. 6, Nov./Dec. 2007, pp. 2521-2525.

Tanenbaum, D.M., et al., "High Resolution Electron Beam Lithograpy Using ZEP-520 and KRS Resists at Low Voltage," *J. Vac. Sci. Technol. B.*, vol. 14, No. 6, Nov./Dec. 1996, pp. 3829-3833.

Zonnevylle, A.C., et al., "Individual Beam Control for MEMS Multi Electron Beam Systems," 2011 EIPBN Conference, Las Vegas, Nevada, 2 pages.

Chang, T.H.P., et al., "Multiple Electron-Beam Lithography," *Microelectronic Engineering*, 57-58, 2001, pp. 117-135.

Klein, C., et al., "Projection Mask-Less Lithography (PML2)," *Microelectronic Engineering*, vol. 87, 2010, pp. 1154-1158.

Mohammadi-Gheidari, A., et al., "Multibeam Scanning Electron Microscope: Experimental Results," *J. Vac. Sci. Technol. B*, vol. 28, No. 6, Nov./Dec. 2010, pp. C6G5-C6G10.

Winograd, G., et al., "Demonstration of Multiblanker Electron-Beam Technology,", *J. Vac. Sci. Technol. B*, vol. 18, No. 6, Nov./Dec. 2000, pp. 3052-3056.

Zhang, Y., et al., "Integrated Multi-Electron-Beam Blanker Array for Sub-10-nm Electron Beam Induced Deposition," *J. Vac. Sci. Technol. B*, vol. 24, No. 6, Nov./Dec. 2006, pp. 2857-2860.

Chinese Search Report with English Language Translation, dated Sep. 6, 2015, Chinese Application No. 201280034520.3.

Taiwanese Search Report with English Language Translation, dated Aug. 10, 2015, Taiwanese Application No. 101115112.

Office Action in Japanessse Application No. 2014-508307 mailed Jun. 16, 2015 and English translation. 11 pages.

First Office Action in the corresponding Chinese Patent Application No. 201280028667.1 dated Jun. 3, 2015 and English translation (19 pages).

(56) References Cited

OTHER PUBLICATIONS

Japanese Office Action with English Language Translation, dated May 10, 2016, Japanese Application No. 2014-523884.
Office Action in Taiwanese Application No. 101119563 dated Jul. 12, 2016, with English translation. 22 pages.
Japanese Office Action with English Language Translation, dated Sep. 13, 2016, Japanese Application No. 2014-508307.
Japanese Office Action with English Language Translation, dated Feb. 9, 2016, Japanese Application No. 2014-508307.
Russian Decision of Grant with English Language Translation, dated Feb. 5, 2016, Russian Application No. 2013152639.

* cited by examiner

CHARGED PARTICLE MULTI-BEAM APPARATUS INCLUDING A MANIPULATOR DEVICE FOR MANIPULATION OF ONE OR MORE CHARGED PARTICLE BEAMS

This is a non-provisional application claiming the benefit of U.S. Provisional Application No. 61/491,865, filed May 31, 2011.

BACKGROUND

1. Field of the invention

The invention relates to a method for influencing and/or controlling the trajectory of one or more charged particle beamlets in a charged particle multi-beamlet apparatus.

The invention more specifically relates to a charged particle multi-beamlet apparatus using a plurality of charged particle beamlets, said apparatus comprises a manipulator device for manipulation of one or more charged particle beams of the plurality of charged particle beamlets. For example, multi electron beam systems are being developed for high throughput maskless lithography systems, multi electron beam microscopy and multi electron beam induced deposition devices.

The invention further relates to a maskless charged particle multi-beamlet lithography system, a charged particle multi-beamlet microscopy system, a charged particle multi-beamlet beam induced deposition device, and a manipulator device for use in a charged particle multi-beamlet apparatus.

2. Description of the Related Art

A charged particle multi-beamlet lithography system for exposing a target using a plurality of beamlets is disclosed for example in WO 2009/127659 A2. The lithography device comprises a deflection device comprising a plurality of deflectors, wherein the deflection device comprises a plurality of memory cells, each cell being provided with a storage element and being connected to a deflector. The storage element is effectively used as a control signal of a locally available amplifier, which provides a substantially digital signal to the deflectors. In other words, the deflector is either on or off. This is a very important step for obtaining a high accuracy of the patterning step of the lithography system, and a high wafer throughput.

SUMMARY OF THE INVENTION

The present invention aims to provide a manipulator device and a charged particle multi-beamlet apparatus comprising such a manipulator device enabling an improved manipulation of individual beamlets of said plurality of beamlets.

According to a first aspect, the invention provides a method for influencing and/or controlling the trajectory of one or more charged particle beamlets in a charged particle multi-beamlet apparatus, wherein said apparatus comprises a manipulator device for manipulation of one or more charged particle beams of a plurality of charged particle beamlets in the charged particle multi-beamlet apparatus, wherein the manipulator device comprises:

a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and an electronic control circuit for providing control signals to the one or more electrodes of each through opening of the array of through openings, wherein the method comprises the step of providing individual adjustment control for each through opening by providing the one or more electrodes of each individual through opening with an at least substantially analog adjustable voltage.

By providing a voltage to the one or more electrodes, an electrostatic field can be generated which field can be used for influencing and/or controlling the trajectory of the charged particle in a charged particle beamlet. Until now the individual manipulation of beamlets, at least in a charged particle optical column wherein the multiple beamlets originates from one source which emits a charged particle beam that is split in said plurality of beamlets, is limited to a deflector array for substantially digitally on or off switching of individual beamlets.

The manipulator device of the present invention is able to provide an individual adjustable voltage control for the electrodes of each individual through opening. Preferably, the voltage can be set at various different levels for each individual through opening, providing individual adjustment control for each beamlet. In particular, the voltage is individual adjustable for each electrode.

In an embodiment, the charged particle multi-beamlet apparatus comprises a sensor for determining at least one characteristic of said charged particle beamlets, wherein the sensor is connected to said electronic control circuit, wherein the method comprises the step of providing individual adjustment control for each through opening based on a feedback signal provided by the sensor to the electronic control circuit.

Usually any deterioration and/or drift in the alignment of the beamlets occurs at a very slow pace. It is this insight of the inventor which has let him to realize that such a slow deterioration and/of drift can be corrected for each individual beamlet of the plurality of beamlets is a multi-beamlet apparatus.

According to the invention the alignment of the individual beamlets is periodically checked, for example each time during the exchange of a target in a lithography system, the beamlets are checked using the sensor and the control circuit adjusts the control signals in order to provide corrected settings for the manipulator device to at least substantially correct for a deterioration and/or drift of one or more of the individual beamlets. Subsequently, the corrected setting of the manipulator device is maintained during the processing of the subsequent target.

Alternatively, the combination of manipulator, control circuit and sensor also enables a feedback system for adjusting and/or optimizing each beamlet and/or the alignment of each beamlet individually in a charged particle multi-beamlet apparatus, in particular a multi-beamlet charged particle lithography system. In an embodiment the feedback system is arranged for dynamically adjusting and/or optimizing each beamlet and/or the alignment of each beamlet individually. This feedback system is preferably arranged, preferably as a whole, in the charged particle multi-beamlet apparatus, in particular in the multi-beamlet charged particle lithography system.

In an embodiment, the manipulator device is arranged for focusing, deflection or stigmation (in particular reducing astigmatism) of individual beamlets of said plurality of beamlets. The improved manipulator device of the invention can be used for manipulation of individual beamlets of said plurality of beamlets not only for deflecting individual beamlets, but also for other functions, such as individual focusing of beamlets or astigmatism correction of individual beamlets, as will be apparent from the description of the embodiments below.

The electronic control circuit is arranged for providing each of the one or more electrodes of each individual through opening with an at least substantially analog adjustable voltage. Using such an adjustable voltage, small corrections can be made to each beamlet, for example for a correction of the angle of deflection, for adjusting the strength of an electrostatic lenslet or for providing a correction for astigmatism, in order to optimize the plurality of beamlets.

In one embodiment, the electronic control circuit is at least partially arranged on the planar substrate and at least partially adjacent to said through openings.

In one embodiment, each through opening is arranged for providing a passage for one single beamlet. In an alternative embodiment, each through opening is arranged for providing a passage for several beamlets, for example a group of 7×7 beamlets.

In one embodiment, the planar substrate is a wafer, and wherein the electronic control circuit comprises an integrated circuit on said planar substrate. In one embodiment, the electronic control circuit is at least partially arranged in-between two through openings. Suitably, the control circuit is arranged near the actual trough openings with the one or more electrodes. In particular between through openings, more particular in non-beam areas between two groups op through openings, the electronic control circuit can be suitably arranged.

In one embodiment, the electronic control circuit comprises a memory for storing control data for the one or more electrodes of one or more individual through openings, which memory is arranged on the planar substrate and adjacent to said through openings. In a further embodiment, said memory is arranged for storing control data for setting the voltage at various different levels for each individual through opening.

In one embodiment, the memory is arranged for storing control data for the one or more electrodes of one individual through opening, which memory is arranged on the planar substrate and adjacent to said individual through opening. In one embodiment, the memory is arranged in-between two through openings.

In one embodiment, the one or more electrodes comprise a metal that is deposited on the planar substrate. In one embodiment, the metal comprises Molybdenum. Although a structuring of deposited Molybdenum on a wafer is a difficult process, it is advantageous because its surface oxide is electrically conducting, thereby minimizing beam errors due to charging of said electrodes.

In one embodiment, the one or more electrodes are arranged in and/or on said substrate. In one embodiment, the through openings extend at least substantially transverse to a surface of said substrate.

In one embodiment, the one or more electrodes of a through opening are at least partially arranged against an inwards facing wall of said through opening. In one embodiment, said one or more electrodes extend into the trough opening in a direction substantially parallel a centre line of said through opening. Such electrodes can provide a more homogeneous electrostatic field for more accurate manipulating the charged particles in a beamlet.

In one embodiment, the one or more electrodes of each through opening are at least substantially surrounded by an earthed electrode. In one embodiment, the earthed electrode comprises a metal that is deposited on the planar substrate. In one embodiment, the metal comprises Molybdenum. Since the individual through openings and their electrodes are arranged at close proximity, the surrounding earthed electrode at least reduces crosstalk.

In one embodiment, a surface of the one or more electrodes that faces away from the planar substrate is arranged at a height between the planar substrate and a surface of the earthed electrode that faces away from said planar substrate. In one embodiment, a thickness of the earthed electrode on the planar substrate is larger than a thickness of the one or more electrodes on the planar substrate. In these embodiments, the one or more electrodes are arranged at a recessed location with respect to the surrounding earthed electrode. The higher level of the surrounding earthed electrode with respect to the level of the one or more electrodes at a through opening further reduces any crosstalk between the one or more electrodes of adjacent through openings. In addition, the higher level of the surrounding earthed electrode with respect to the level of the one or more electrodes at a through opening reduces beam errors due to electrostatic stray fields.

In one embodiment, the electronic control circuit comprises connecting leads for connecting the electronic control circuit with the one or more electrodes, wherein at least one of said connecting leads is at least partially arranged between two earthed electrically conducting layers. In one embodiment, the at least one of said connecting leads is at least partially arranged between two earthed leads. By arranging at least some of the connecting leads, at least partially between conducting layers and/or leads, said leads are shielded which reduces any interference between the connecting leads.

In one embodiment, said manipulator device comprises an array of electrostatic lenses, wherein each of said electrostatic lenses comprises one through opening of said array of through openings, wherein each of the through openings comprises one electrode arranged around the corresponding through opening, and wherein the electronic control circuit is arranged for providing the one electrode of each individual through opening of a lens of said array of electrostatic lenses with an adjustable voltage for individually adjusting a strength of said lens.

In one embodiment, said manipulator device comprises an array of electrostatic deflectors, wherein each of said electrostatic deflectors comprises one through opening of said array of through openings, wherein each of the through openings comprises two or more electrodes arranged around the corresponding through opening, and wherein the electronic control circuit is arranged for providing the two or more electrodes of each individual through opening of a deflector of said array of electrostatic deflectors with an adjustable voltage for individually adjusting an amount of deflection of a charged particle beamlet induced by said deflector.

In one embodiment, said manipulator device comprises an array of electrostatic astigmatic correctors, wherein each of said electrostatic astigmatic correctors comprises one through opening of said array of through openings, wherein each of the through openings comprises eight electrodes arranged around the corresponding through opening, and wherein the electronic control circuit is arranged for providing the eight electrodes of each individual through opening of an astigmatic corrector of said array of electrostatic astigmatic correctors with an adjustable voltage for individually adjusting an amount of astigmatism correction of a charged particle beamlet induced by said astigmatic corrector.

In one embodiment, the electronic control circuit comprises a demultiplexer for extracting control data for one or more individual through openings from a multiplexed signal, which demultiplexer is arranged on the planar substrate and adjacent to said through openings.

In one embodiment, the demultiplexer is arranged for extracting control data for the one or more electrodes one individual through opening, which demultiplexer is arranged on the planar substrate and adjacent to said individual through opening.

In one embodiment, the demultiplexer is arranged in-between adjacent through openings.

In one embodiment, the number of connecting leads to the device is substantially smaller than the number of electrodes. In one embodiment, the number of connecting leads to a through opening is smaller than the number of electrodes of said through opening.

According to a second aspect, the invention provides a charged particle multi-beamlet apparatus comprising a manipulator device for manipulation of one or more charged particle beams of a plurality of charged particle beamlets in the charged particle multi-beamlet apparatus, wherein the manipulator device comprises:

a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and an electronic control circuit for providing control signals to the one or more electrodes of each through opening, wherein the electronic control circuit is arranged for providing the one or more electrodes of each individual through opening with an at least substantially analog adjustable voltage.

In one embodiment, the charged particle multi-beamlet apparatus further comprises a sensor for determining at least one characteristic of said plurality of charged particle beamlets, wherein the sensor is connected to said electronic control circuit for providing a feedback signal. Such a feedback arrangement is particularly advantageous in a multi-beamlet system in order to enable an automated feedback for the individually adjustable voltages of each of the one or more electrodes of each of the individual through openings, for setting each of the adjustable voltages to a required value for obtaining the desired correction of each beamlet of said plurality of charged particle beamlets.

In one embodiment, the manipulator device is a first manipulator device having a first planar substrate comprising a first array of through openings in the plane of the first planar substrate, wherein the charged particle beam apparatus comprises a second manipulator device having a second planar substrate comprising a second array of through openings in the plane of the second planar substrate, wherein each of the through openings comprises one or more electrodes arranged around the corresponding through opening, and wherein the one or more electrodes are arranged in and/or on said substrate, wherein the second planar substrate is arranged at a distance and substantially parallel to the first planar substrate, wherein each through opening of the second array of through openings are at least substantially in line with a through opening of the first array of through opening. In one embodiment, the through openings have a radius r, and wherein the distance d between the first and second planar substrate is equal or smaller than the radius r. In one embodiment, the one or more electrodes of the first and second manipulator device are arranged on said first and second substrate, respectively, and wherein the one or more electrodes on the first substrate and the one or more electrodes on the second substrate face each other. In one embodiment, the second manipulator device is at least substantially mirror symmetrical to the first manipulator device, at least with respect to a centre plane between the first and second manipulator device.

According to a third aspect, the invention provides a charged particle multi-beamlet maskless lithography device comprising a manipulator device for manipulation of one or more charged particle beams of a plurality of charged particle beamlets in the charged particle multi-beamlet maskless lithography device, wherein the manipulator device comprises:

a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and an electronic control circuit for providing control signals to the one or more electrodes of each through opening, wherein the electronic control circuit is arranged for providing the one or more electrodes of each individual through opening with an at least substantially analog adjustable voltage.

In an embodiment, the charged particle multi-beamlet maskless lithography device and/or the manipulator device thereof is provided with one or more of the measures described in the above mentioned embodiments.

According to a fourth aspect, the invention provides a manipulator device for manipulation of one or more charged particle beams of a plurality of charged particle beamlets in a charged particle multi-beamlet apparatus, wherein the manipulator device comprises:

a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and an electronic control circuit for providing control signals to the one or more electrodes of each through opening, wherein the electronic control circuit is arranged for providing the one or more electrodes of each individual through opening with an at least substantially analog adjustable voltage.

In an embodiment, the manipulator device is provided with one or more of the measures described in the above mentioned embodiments.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Multi-electron beam systems are being developed for high throughput lithography, multi-electron beam microscopy and multi-electron bean induced deposition. In particular, for Lithography and deposition systems, individual beam blanking, that is on or off switching, is used for patterning.

However, it would also be advantageous to position, focus, vector scan and stigmate the beamlets individually. Up until now, there are no manipulator device for manipulation of one or more charged particle beams of a plurality of charged particle beamlets individually with respect to an individual adjustment in position, focus, vector scan or stigmate. One problem of such a system is the enormous amount of data required for the individual control of each beamlet individually. An other problem is the small size of each manipulator and the small spacing between adjacent manipulators.

The present invention proposes to uses MEMS technology for the manufacturing of manipulator devices comprising an array of manipulators for manipulating one or more charged particle beamlets of a plurality of charged particle beamlets. The manipulators preferably have lateral sizes ranging form approximately 150 micrometers to 2 micrometers, depending on their purpose.

One of the challenges is to design electrodes with a fabrication process that is compatible with chip fabrication and electron optical design rules. Furthermore it is desirable to control thousands of beams without having thousands of external control wires.

Figure 1:
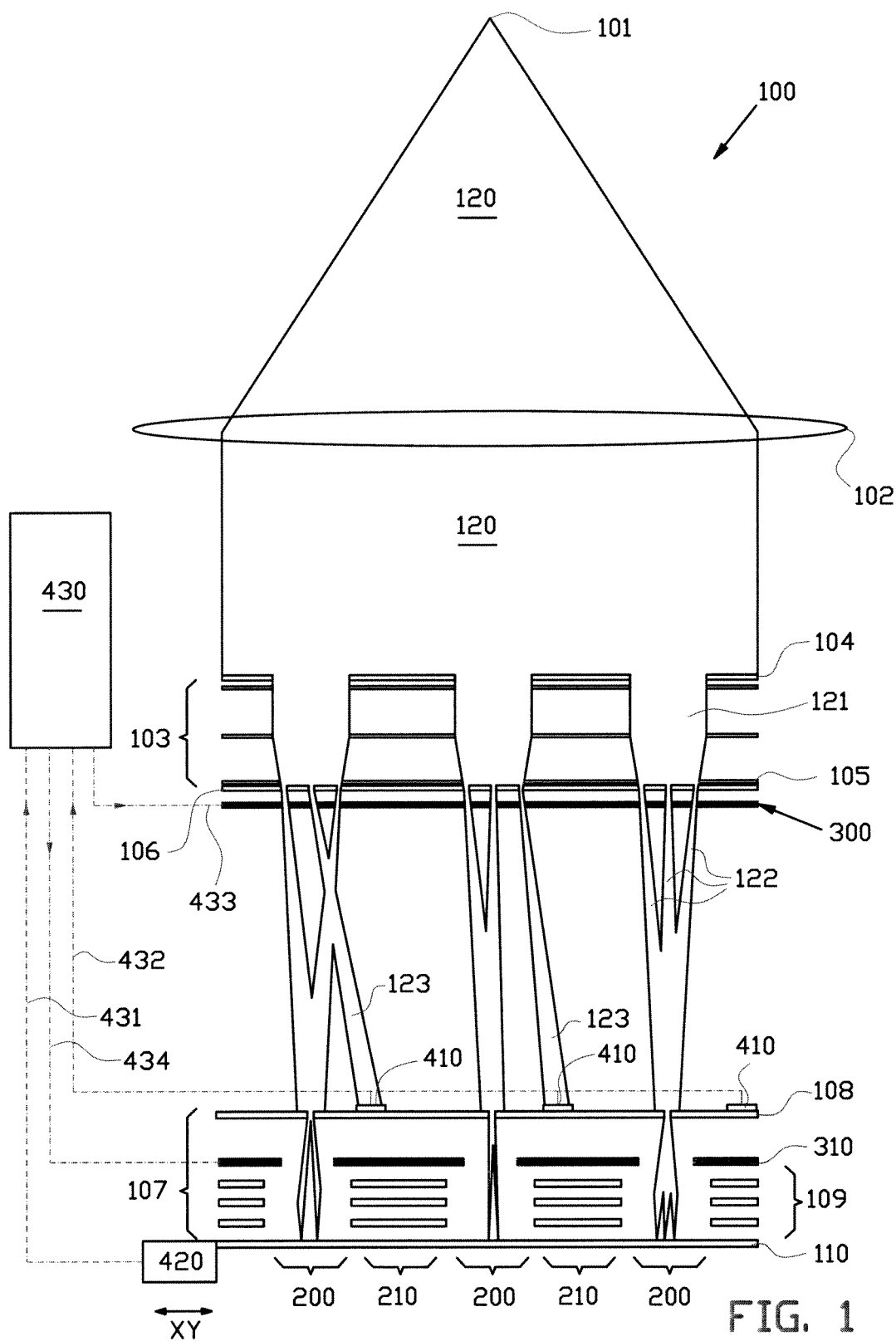
FIG. 1 shows a schematic cross section of a charged particle multi-beamlet maskless lithography system.

FIG. 1 shows a schematic drawing of a charged particle multi-beamlet lithography device 100 based upon a charged particle beam optical system without a common cross-over of all the charged particle beamlets. Such a lithography system comprises a charged particle source 101, for example an electron source, for producing an expanding charged particle beam 120. The expanding beam passes a collimator lens 102 for collimating the charged particle beam 120.

Subsequently the collimated beam 120 impinges on an aperture array 104, which blocks part of the collimated beam 120 for creating sub-beams 121. The sub-beams 121 impinge on a further aperture array 105 for creating beamlets 122. A condenser lens array 103 (or set of condenser lens arrays) is included for focusing the sub-beams 121 towards a corresponding opening in the beam stop array 108 of end module 107.

The beamlet creating aperture array 105 is preferably included in combination with a beamlet blanker array 106, for example arranged close together with aperture array 105 before the blanker array 106.

As shown in FIG. 1, the condenser lens or lenses 103 focus sub-beam 121 either in or towards a corresponding opening in beam stop array 108 of end module 107. In this example, the aperture array 105 produces three beamlets 122 from sub-beam 121, which strike the beam stop array 108 at a corresponding opening so that the three beamlets 122 are projected onto the target 110 by the projection lens system 109 in end module 107. In practice a group of beamlets with a much larger number of beamlets may be produced by aperture array 105 for each projection lens system 109 in end module 107. In a practical embodiment typically around fifty beamlets may be directed through a single projection lens system 109, and this may be increased to two hundred or more. As shown in FIG. 1, the beamlet blanker array 106 may deflect individual beamlets in a group of beamlets 122 at certain times in order to blank them. This is illustrated by blanked beamlet 123, which has been deflected to a location on the beam stop array 108 near to but not at an opening.

In accordance with the invention, the charged particle optical column may be provided with one or more manipulator devices as described in more detail below. Such a manipulator device 300 may be arranged behind the collimator lens 102 for:

providing a deflection in a plane substantially perpendicular to an optical axis of the charged particle optical column in order to correct for misalignments of one or more of the devices of charged particle optical column, and/or providing a correction for any astigmatism which may be caused by a macroscopic lens—usually a magnetic lens—which diffracts the whole beam 120, all sub-beams 121 or all beamlets 122, such as the collimator lens 102.

Such a manipulator device 310 may also be provided as part of the end module 107 for providing a two dimensional deflection in the projection lens system 109 and enabling a vector scan of the beamlets in one group.

The manipulator device 300, 310 is connected to an electronic control circuit 430, which provides control signals 433, 434 to the manipulator device 300, 310.

In addition the charged particle optical column is provided with a sensor for determining at least one characteristics of a beamlet of the plurality of beamlets, wherein the sensor is connected to the electronic control circuit 430 in order to provide a feedback signal. Such a sensor 410 can be provided at the beam stop array 108, preferably at the location where the beamlets are directed when blanked. Alternatively a sensor 420 can be arranged substantially at the location of the target 110 during an exchange of a target which has been process and a target that needs to be processed. During this exchange the detector 420 can be moved XY under the beamlets and the alignment of the beamlets can be checked and if necessary the manipulator devices 300, 310 can be—preferably automatically—adjusted based on the feedback signal 431, 432 provided by the sensor 410, 420 to the electronic control circuit 430.

It is noted that any deterioration and/or drift in the alignment of the beamlets 122 occurs at a very slow pace when compared with the deflection of the beamlets 122 by the beamlet blanker array 106. For example, each time during the exchange of a target the beamlets 122 are checked using the sensors 410, 420 and the control circuit 430 adjusts the control signals 433, 434 in order to provide corrected settings for the manipulator devices 300, 310 to at least substantially correct for a deterioration and/of drift of one or more of the individual beamlets 122. Subsequently, the corrected setting of the manipulator devices 300, 310 is maintained during the processing of the subsequent target.

Alternatively, the combination of manipulator 300, control circuit 430 and sensors 410, 420 also provides a feedback system for adjusting and/or optimizing each beamlet and/or the alignment of each beamlet individually in a charged particle multi-beamlet apparatus, in particular a multi-beamlet charged particle lithography system. In an embodiment the feedback system is arranged for dynamically adjusting and/or optimizing each beamlet and/or the alignment of each beamlet individually. This feedback system is preferably arranged, preferably as a whole, in the charged particle multi-beamlet apparatus, in particular in the multi-beamlet charged particle lithography system.

Figure 2:
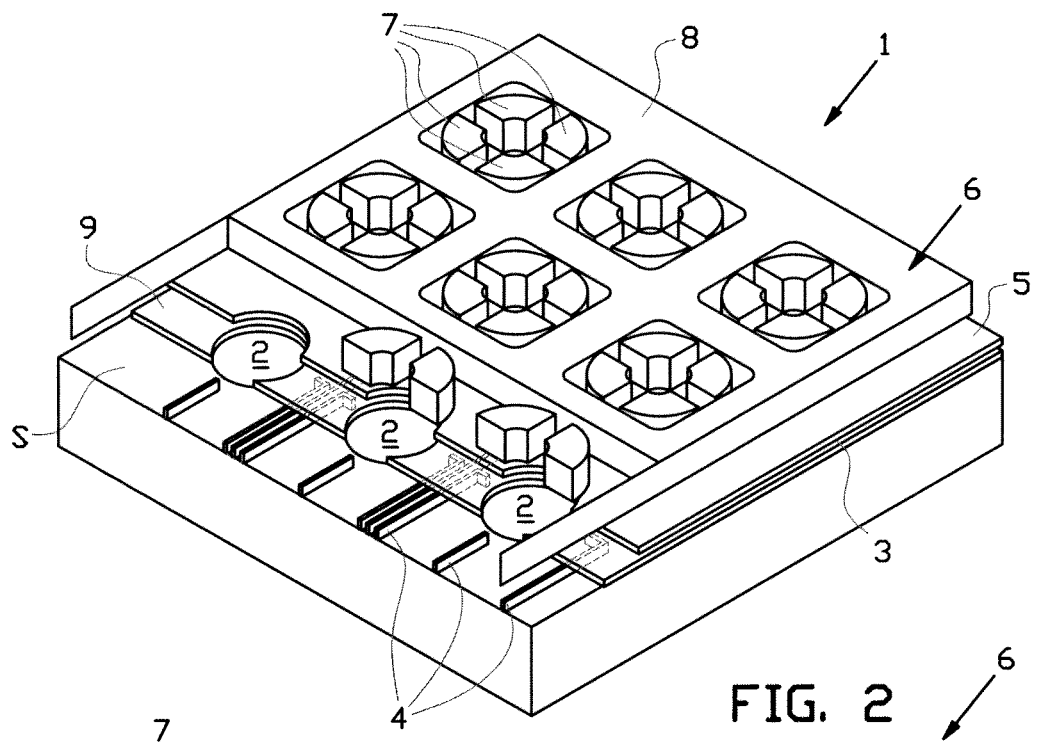
FIG. 2 shows a schematic exploded view of a first example of manipulator device comprising an array of quadropole deflectors.
Figure 3:
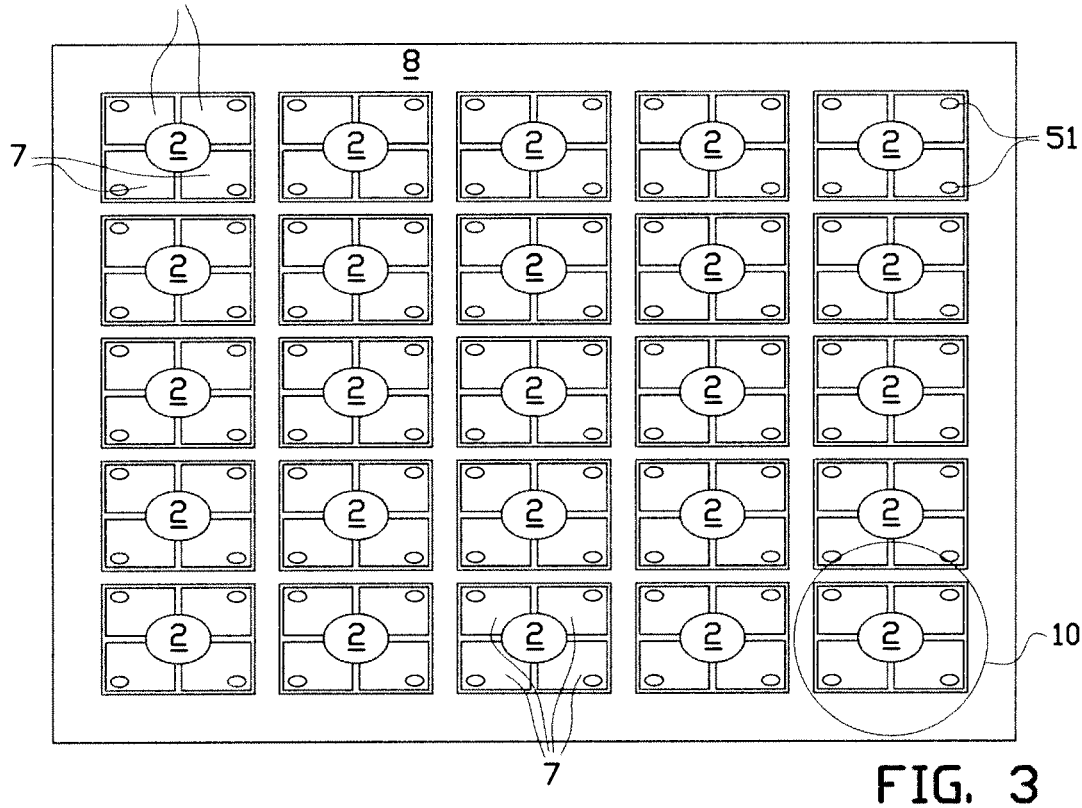
FIG. 3 shows a top view of the quadropole prototype manipulator device of FIG. 1.

In a first example of a manipulator device 300, 310 according to the invention is shown, in part, in FIGS. 2 and 3. FIG. 2 shows a multi-beamlet quadrupole deflector 1, which has been manufactured using MEMS technology. The fabrication process is bipolar compatible allowing local electronics to be incorporated, for example enabling sample and hold functionality.

The multi-beamlet quadrupole deflector 1 comprises a substantially planar substrate 3, which is provided with an array of through openings 2 which are regularly arranged in rows and columns. The through openings 2 extend substantially transverse to the surface S of the planar substrate 3, and are arranged for passing at least one charged particle beamlet there through.

On top of the planar substrate 3, which in this example is a Si chip, an electronic control circuit 4 is arranged. The electronic control circuit 4 comprises an integrated circuit which has been arranged adjacent to the through openings 2, in particularly on non-beam areas of the planar substrate 3. On top of the electronic control circuit 4, an insulating layer 5 is provided, on top op which insulating layer 5, an electrode layer 6 is arranged.

Each of the through openings 2 is provided with four electrodes 7 arranged around the through opening 2 on said substrate 3. Each through opening 2 with its four electrodes 7 forms an individual manipulator 10 for manipulating one or more beamlets which traverse the through opening 2. Thus the manipulator device 1 comprises an array of individual manipulators 10 which are arranged in rows and columns.

The electrodes 7 are preferably made from Molybdenum, however they may also be made from other conducting materials. The electrode layer 6 is approximately 4 micrometers thick, and the electrodes have been made by anisotropic etching of the Molybdenum using reactive ion etching.

It is noted that the four electrodes 7 are surrounded by a remaining part 8 of the electrode layer 6, as shown in the schematic top view of FIG. 2. This remaining part 8, which is electrically isolated from the electrodes 7, is used as an earthed electrode 8 which surrounds the four electrodes 7 at a distance. Under the electrode layer 6, there is a layer of insulating material 5, which is provided with via's 51 for connecting each of the electrode 7 to the electronic control circuit 4 under the layer of insulating material 5.

The electronic control circuit 4 provides control signals to each of the four electrodes 7 of each through opening 2. The electronic control circuit 4 is arranged on the planar substrate 3 and at least partially adjacent to said through openings 2, and is arranged for providing each of the four electrodes 7 of each through opening 2 with an individual adjustable voltage for deflecting one or more charged particle beamlet which, when in use, traverse through said opening 2. Each manipulator 10 of said manipulator device 1 thus can be used for deflecting the charged particle beamlet in any direction in a plane parallel to the surface S of the planar substrate 3, with an adjustable voltage for individually adjusting an amount of deflection of a charged particle beamlet induced by said deflector 10.

Figure 4:
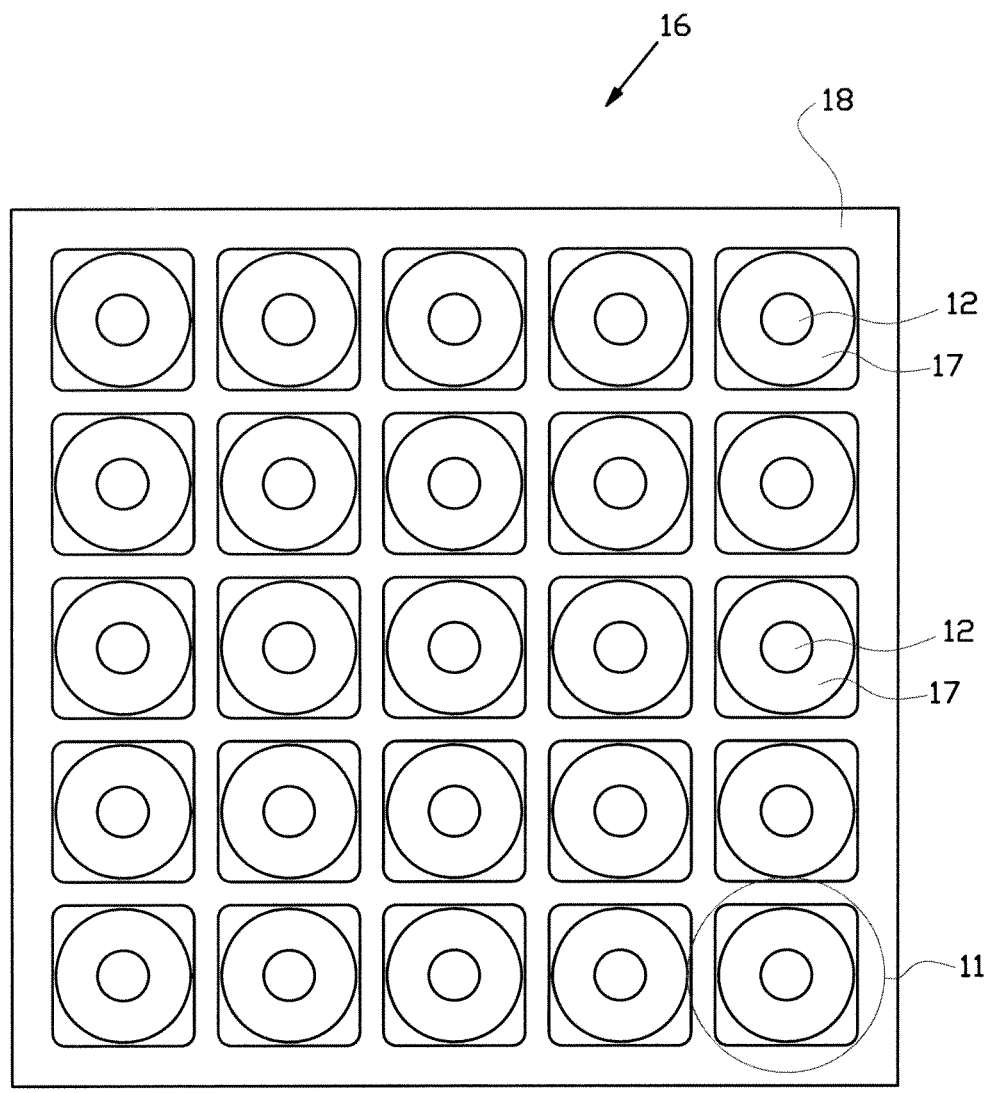
FIG. 4 shows a top view of a second example of an array of manipulators, each comprising one electrode for use in an array of Einzel lenses.
Figure 5:
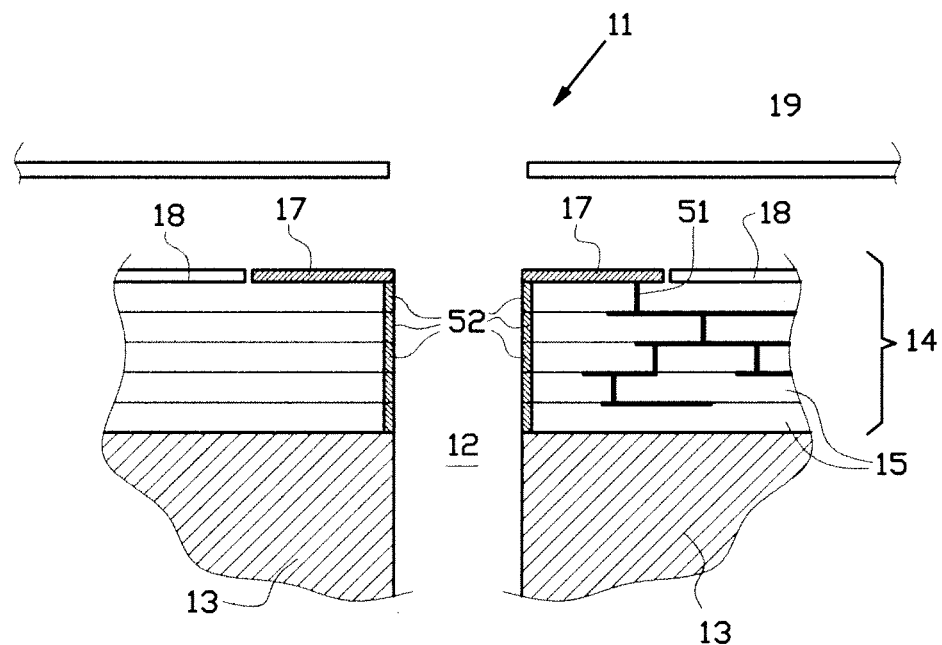
FIG. 5 shows a schematic cross section of one manipulator 11 for use in a manipulator device of FIG. 4.

FIGS. 4 and 5 show a second example of a manipulator 11 for use in a device of the invention. Essentially the manipulator device of this second example comprises the same structure as the device shown in the exploded view of FIG. 2. That is, the device comprises a substantially planar substrate 13, which is provided with an array of through openings 12 which are regularly arranged in rows and columns, as shown in the top view of FIG. 4. The through openings 12 are arranged for passing at least one charged particle beamlet there through, and are provided with one electrode 17 which surrounds the through opening 12.

On top of the planar substrate 13, an electronic control circuit 14 is arranged. The electronic control circuit 14 comprises an integrated circuit which has been arranged adjacent to the through openings 12. In this example the electronic control circuit 14 is built up from several layers 15 with integrated electronic circuitry, which are interconnected with via's 51.

Also at the edge of the through openings 12, via's 52 are provided, which via's 52 are connected to the top electrode 17. The via's 52 provide an extension of the top electrode 17 inside the through opening 12. Thus the electrode 17 of a through opening is at least partially arranged against an inward facing wall of said through opening. The via's 52 at the edge of the through openings are manufactured at the same time and using the same process used for the manufacture of the integrated electronic control circuit 14.

Each of the through openings 12 is provided with one electrodes 17 arranged around the through opening 12 on said substrate 13. At a distance above the planer substrate 13, a further electrode 19 is arranged. The further electrode 19 also comprises an array of through openings 12', which are aligned with the trough openings 12 of the substrate 13, as schematically shown in the cross section in FIG. 5. Each through opening 12 with its electrode 17 and the further electrode 19 forms an individual Einzel lens 11, which in use is provided with an adjustable voltage for individually adjusting a focal distance or strength of said lens 11.

This second example thus provides a manipulator device 16 comprises an array of electrostatic lenses 11, wherein each of said electrostatic lenses 11 comprises one through opening 12 of said array of through openings, wherein each of the through openings 12 comprises one electrode 17 arranged around the corresponding through opening 12, and wherein the electronic control circuit 14 is arranged for providing the one electrode 12 of each individual through opening of a lens 11 of said array of electrostatic lenses with an adjustable voltage for individually adjusting a strength of said lens 11.

Figure 6:
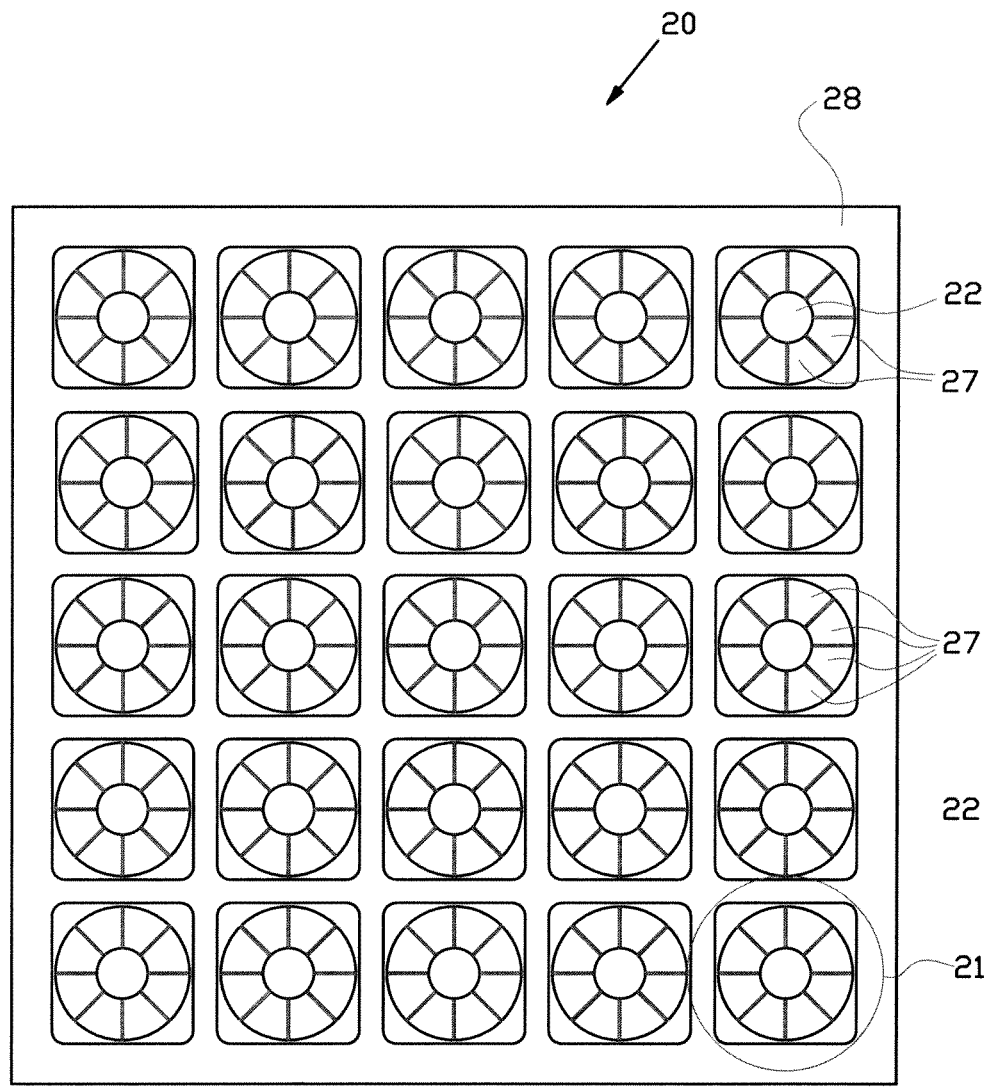
FIG. 6 shows a top view of a third example of an array of manipulators, each manipulator comprising eight electrodes for forming an octopole.

FIG. 6 shows a third example of a manipulator device 20 of the invention. Essentially the manipulator device 20 of this third example comprises the same structure as the device shown in the exploded view of FIG. 2. That is, the device comprises a substantially planar substrate, which is provided with an array of through openings 22 which are regularly arranged in rows and columns, as shown in the top view of FIG. 6. The through openings 22 are arranged for passing at least one charged particle beamlet there through. Each through opening 22 is provided with eight electrodes 27 which surround the through opening 12. Each through opening 12 with its electrodes 17 forms an individual octopole deflector, which in use is provided with an adjustable voltage for individually adjusting a trajectory of beamlets which traverse one of said through openings 12, for example for providing a stigmatic correction for each individual beamlet.

Thus the manipulator device 20 of this third example comprises an array of electrostatic stigmatic correctors 21, for example for correcting any astigmatism of the beamlets, wherein each of said electrostatic stigmatic correctors 21 comprises one through opening 22 of said array of through openings, wherein each of the through openings 22 comprises eight electrodes 27 arranged around the corresponding through opening 22, and wherein the electronic control circuit is arranged for providing the eight electrodes 27 of each individual through opening 22 of a stigmatic corrector 21 of said array of electrostatic stigmatic correctors with an adjustable voltage for individually adjusting an amount of stigmatism correction of a charged particle beamlet induced by said stigmatic corrector.

Figure 7:
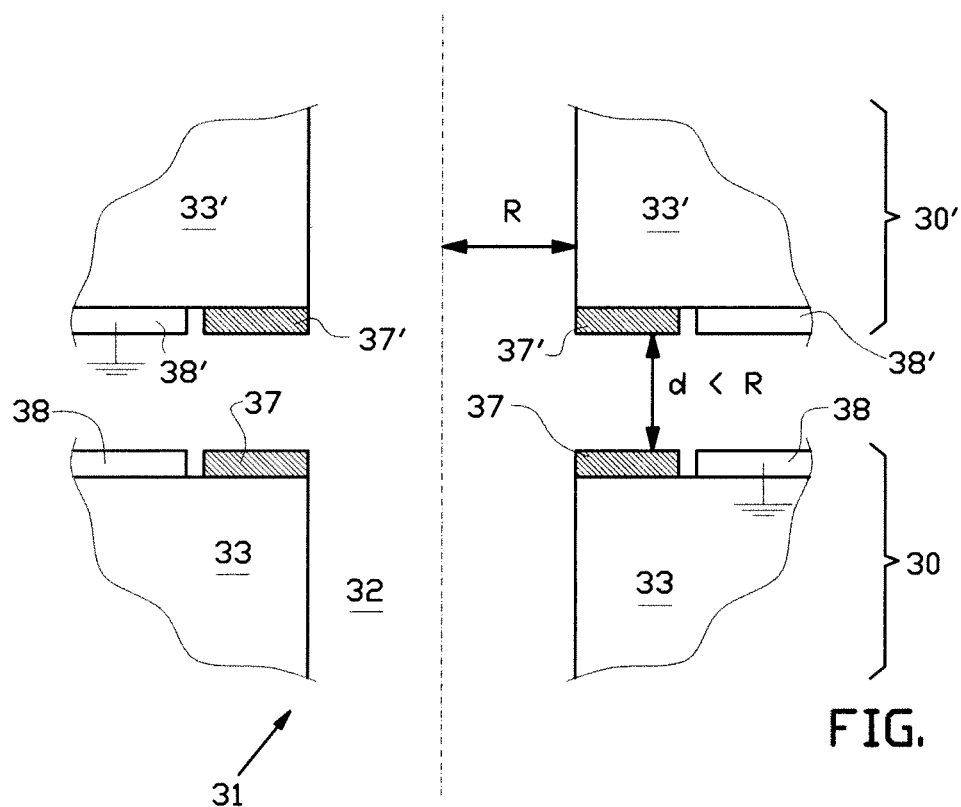
FIG. 7 shows a schematic cross section of a further example of a manipulator for use in a manipulator device.

In a further example of a device of the invention, as shown in the partial cross section of FIG. 7, the device 31 comprises a first manipulator device 30 having a first planar substrate 33 comprising a first array of through openings 32 in the plane of the first planar substrate 33, wherein each of the through openings 32 comprises one or more electrodes 37 arranged around the corresponding through opening 32, and wherein the one or more electrodes 37 are arranged on said substrate 33. In addition the device 31 comprises a second manipulator device 30' having a second planar substrate 33' comprising a second array of through openings 32' in the plane of the second planar substrate, wherein each of the through openings 32' comprises one or more electrodes 37' arranged around the corresponding through opening 32', and wherein the one or more electrodes 32' are arranged on said substrate 33'. The second planar substrate 33' is arranged at a distance d and substantially parallel to the first planar substrate 33, wherein each through opening 32' of the second manipulator device 30' is at least substantially in line with a through opening 32 of the first manipulator device 30. In an embodiment the first 30 and second 30' manipulator devices are formed as one unit.

The through openings 32, 32' have a radius r, and the distance d between the first and second planar substrate is suitably equal or smaller than the radius r. In addition, the one or more electrodes 37, 73' of the first 30 and second 30' manipulator device are arranged on said first 33 and second 33' substrate, such that the one or more electrodes 37 on the first substrate 33 and the one or more electrodes 37' on the second substrate 33' face each other. The second manipulator device 30' is at least substantially mirror symmetrical to the first manipulator device 30, at least with respect to a centre plane between the first 30 and second 30' manipulator device in order to combine each through opening 32 of the first manipulator device 30 with a corresponding through opening 32' of the second manipulator device 30'.

Each of the first 30 or second 30' manipulator devices may comprise an array of deflectors having two or more electrodes 37, 37' for each through opening 32, 32', for example four electrodes as shown in FIGS. 2 and 3, an array of electrostatic lenses having on electrode 37, 37' for each through opening 32, 32', as shown in FIG. 4, and/or an array of electrostatic stigmatic correctors having eight electrodes 37, 37' for each through opening 32, 32', as shown in FIG. 6.

Figure 8A:
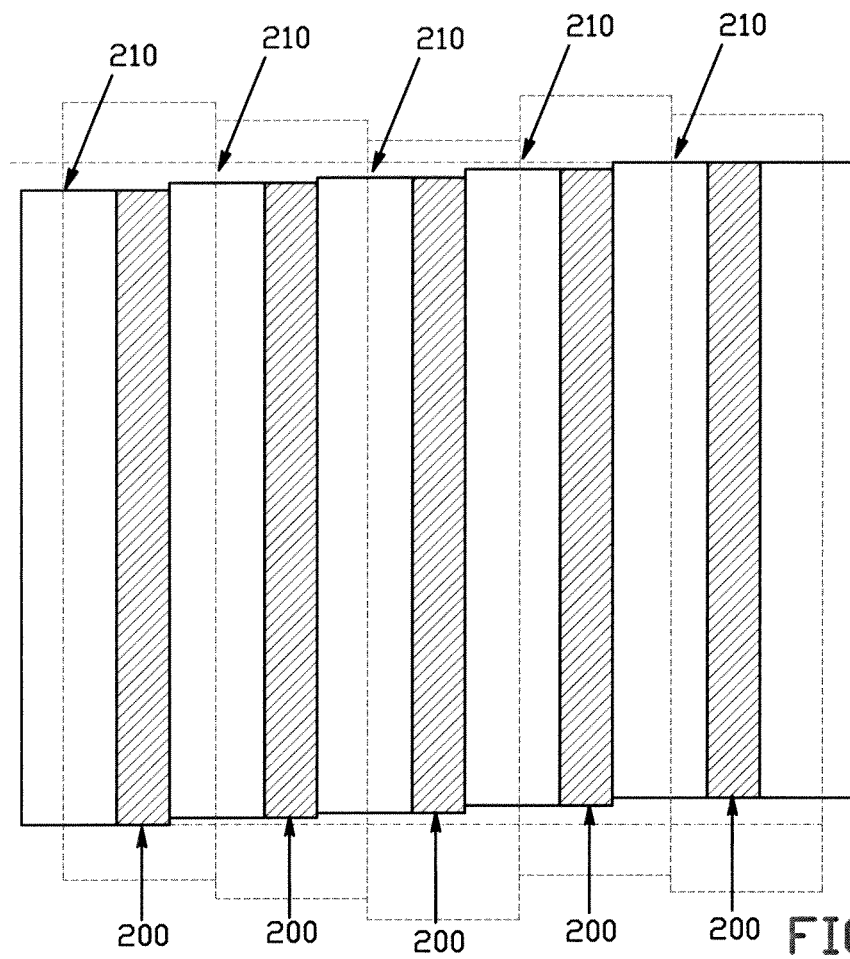
FIG. 8A shows a schematic top view of the manipulator device for use in the lithography system of FIG. 1.
Figure 8B:
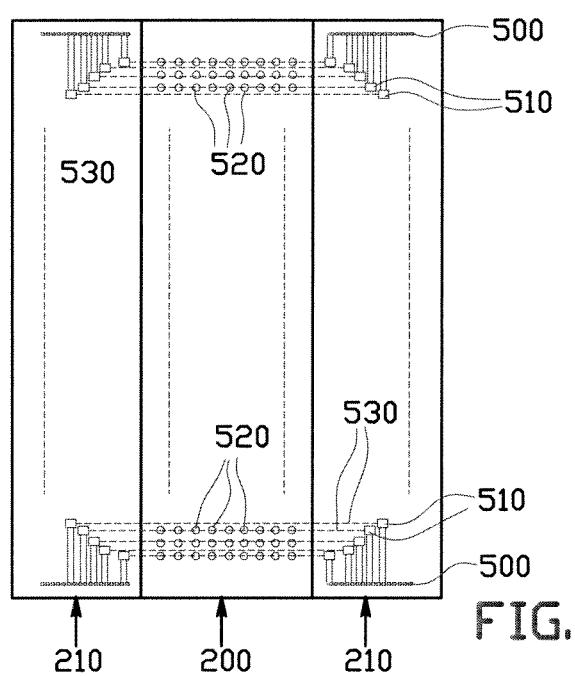
FIG. 8B shows a detail of the schematic top view of FIG. 8A, schematically showing the electronic control circuit in the non-beam areas.

Referring back to the charged particle multi-beamlet lithography device 100 as shown in FIG. 1, it is noted that the beamlets 122 are arranged groups. Due to the grouping of the beamlets 122, the devices of charged particle optical column after the aperture array 104, which blocks part of the collimated beam 120 for creating sub-beams 121, can be divided in beam areas 200 and non-beam 210 areas, as schematically depicted in FIG. 8A. These non-beam areas 210, which are located between groups of beamlets, for example as defined by the sub-beams 121, can be used as a location for the electronic control circuit 510 which controls the manipulators 520 arranged in the beam areas 200, as schematically shown in FIG. 8B. Near the edges of the non-beam areas, connectors 500 are provided, which are connected to the electronic control circuits 510 for each manipulator 520 in the beam area 200, using data lines. From each electronic control circuit 510 voltage lines are directed to the individual electrodes of each manipulator 520 for providing each electrode with an individual adjustable voltage.

At the location of the non-beam areas 210 enough room is available for arranging memory devices of the integrated electronic control circuit for storing control data for the manipulator devices arranged in the adjacent beam area 200. In particular the memories are arranged for storing control data for setting the voltage at various different levels for each individual manipulator 520.

Also a demultiplexer is arranged in the non-beam areas 210 for demultiplexing a multiplexed data signal and transmitting the demultiplexed data to the electronic control circuit and/or the memory devices thereof. Such an embodiment requires substantially one data lead per non-beam area 201, which dramatically reduces the number of connecting leads.

Figure 9:
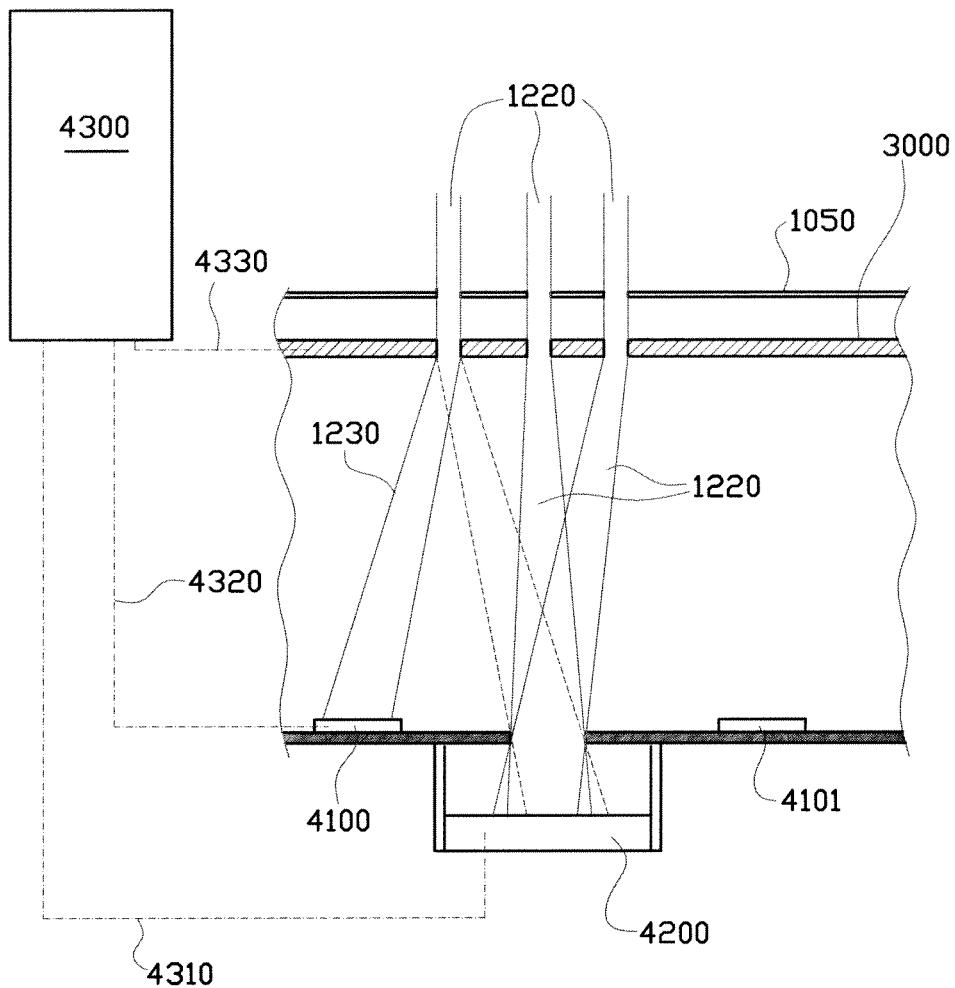
FIG. 9 shows a schematic cross section of a charged particle multi-beamlet inspection apparatus.

A further exemplary embodiment of the inventions is shown in FIG. 9. FIG. 9 shows a schematic cross section of a charged particle multi-beamlet inspection apparatus for measuring beam properties of individual beamlets. The charged particle multi-beamlet inspection apparatus comprises entrance aperture array 1050 which, in use, is aligned with a group of beamlets 1220 so that these beamlets 1220 enter the inspection apparatus. In accordance with the invention, the inspection apparatus comprises a manipulator device 3000 comprising individual beamlet manipulators 2, 22, as for example shown in FIGS. 2, 3 and 6, for individually deflecting one or more of the beamlets 1220 in accordance with a control signal 4330 from a controller 4300. At a side from the manipulator device 3000 facing away from the entrance aperture array 1050 and at a distance from the manipulator device 3000, a series of sensors 4100, 4101, 4200 are arranged.

In this example, the series of sensors comprises a central sensor 4200 which comprises a Faraday cup. When the controller 4300 provides control signals 4330 to the individual beamlet manipulators of the manipulator device 3000 to deflect all beamlets 1220 into the Faraday cup 4200, the total current of the charged particle beamlets 1220 is measured. A measuring signal 4310 of the measurement of the Faraday cup 4200 is directed to the controller 4300 and can be displayed, stored and/or further evaluated in the controller 4300.

In addition, the central censor 4200 is surrounded by several sensors 4100, 4101 for measuring beam properties of individual beamlets 1230. In order to measure the beam properties of an individual beamlet 1230, the controller 4300 provides a control signal 4330 in order to deflect the individual beamlet 1230 onto one of the sensors 4100. In case the manipulation device 3000 comprises individual deflectors 2 as shown in FIGS. 2, 3, the individual beamlets 1230 can be deflected in any direction and the amount of deflection in a certain direction can be individually adjusted. Thus each individual beamlet 1230 can be subsequently directed to two or more sensors 4100, 4101 in order to measure different beam properties. For example one of the two or more sensors 4100, 4101 is arranged for measuring the total current of the individual beamlet 1230, a second sensor of the two or more sensors 4100, 4101 is arranged for measuring a first beam profile while the individual beamlet 1230 is scanned in a first direction over the second sensor, and a third sensor of the two or more sensors 4100, 4101 is arranged for measuring a second beam profile while the individual beamlet 1230 is scanned in a second direction, which is at least substantially perpendicular to the first direction, over the third sensor. A measuring signal 4320 of the measurement of the sensors 4100, 4101 is directed to the controller 4300 and can be displayed, stored and/or further evaluated in the controller 4300.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the present invention relates to a method and a device for manipulation of one or more charged particle beams of a plurality of charged particle beamlets in a charged particle multi-beamlet apparatus. The manipulator device comprises a planar substrate comprising an array of through openings in the plane of the substrate, each of these through openings is arranged for passing the at least one charged particle beamlet there through, wherein each of the through openings is provided with one or more electrodes arranged around the through opening, and a electronic control circuit for providing control signals to the one or more electrodes of each through opening, wherein the electronic control circuit is arranged for providing the one or more electrodes of each individual through opening with an at least substantially analog adjustable voltage.

The invention claimed is:

1. Method for influencing and/or controlling the trajectory of one or more charged particle beamlets in a charged particle multi-beamlet apparatus, wherein the charged particle multi-beamlet apparatus comprises an optical column for:
   producing an expanding charged particle beam using a charge particle source,
   collimating the charged particle beam using a collimator,
   using an aperture array for creating multiple beamlets for exposing a target,
   deflecting individual beamlets in a group of beamlets at certain times in order to blank them using a beamlet blanker array,
   stopping the deflected individual beamlets using a beam stop array, and
   projecting the non-stopped beamlets onto a target using a projection lens system, and
   wherein each of the multiple beamlets exposes the target when not blanked by the beamlet blanker array,
   wherein said apparatus comprises a manipulator device for manipulation of one or more charged particle beams of a plurality of charged particle beamlets in the charged particle multi-beamlet apparatus, wherein the manipulator device is arranged between the beamlet blanker array and the beam stop array, wherein the manipulator device comprises:
   a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and
   an electronic control circuit for providing control signals to the one or more electrodes of each through opening of the array of through openings,
   wherein the method comprises the step of providing individual adjustment control for each through opening by providing the one or more electrodes of each individual through opening with an at least substantially analog adjustable voltage, wherein the charged particle multi-beamlet apparatus comprises a sensor for measuring at least one characteristic of said charged particle beamlets incident on said sensor, wherein the sensor is connected to said electronic control circuit, wherein the sensor is provided at a location where beamlets are directed to when blanked or at the location of the target during an exchange of a target which has been processed and a target to be processed, wherein the method comprises the step of, based on a feedback signal provided by the sensor to the electronic control circuit, providing said individual adjustment control for each through opening by setting each of the adjustable voltages to a value for obtaining the desired correction of each beamlet in order to provide corrected settings for the manipulator device to at least substantially correct for a deterioration and/or drift of one or more of the individual beamlets.

2. Method according to claim 1, wherein said manipulator device comprises an array of electrostatic lenses, wherein each of said electrostatic lenses comprises one through opening of said array of through openings, wherein each of the through openings comprises one electrode arranged around the corresponding through opening, and wherein the electronic control circuit is arranged for individually adjusting a strength of each of said electrostatic lenses by providing the one electrode of each individual through opening of a lens of said array of electrostatic lenses with an at least substantially analog adjustable voltage.

3. Method according to claim 1, wherein said manipulator device comprises an array of electrostatic deflectors, wherein each of said electrostatic deflectors comprises one through opening of said array of through openings, wherein each of the through openings comprises two or more electrodes arranged around the corresponding through opening, and wherein the electronic control circuit is arranged for individually adjusting an amount of deflection of a charged particle beamlet induced by said deflector by providing the two or more electrodes of each individual through opening of a deflector of said array of electrostatic deflectors with an at least substantially analog adjustable voltage.

4. Method according to claim 1, wherein said manipulator device comprises an array of electrostatic astigmatism correctors, wherein each of said electrostatic astigmatism correctors comprises one through opening of said array of through openings, wherein each of the through openings comprises eight electrodes arranged around the corresponding through opening, and wherein the electronic control circuit is arranged for individually adjusting an amount of astigmatism correction of a charged particle beamlet induced by said astigmatism corrector by providing the eight electrodes of each individual through opening of an astigmatism corrector of said array of electrostatic astigmatism correctors with an at least substantially analog adjustable voltage.

5. Method according to claim 1, wherein the manipulator device is arranged for:
deflecting one or more of said one or more charged particle beamlets in a plane substantially perpendicular to an optical axis of the charged particle optical column in order to correct for misalignments of one or more of the devices of charged particle optical column, and/or
correcting one or more of said one or more charged particle beamlets for astigmatism.

6. Method for influencing and/or controlling the trajectory of one or more charged particle beamlets in a charged particle multi-beamlet apparatus, wherein the charged particle multi-beamlet apparatus comprises an optical column for:
producing an expanding charged particle beam using a charge particle source,
collimating the charged particle beam using a collimator,
using an aperture array for creating multiple beamlets for exposing a target,
deflecting individual beamlets in a group of beamlets at certain times in order to blank them using a beamlet blanker array,
stopping the deflected individual beamlets using a beam stop array, and
projecting the non-stopped beamlets onto a target using a projection lens system, and
wherein each of the multiple beamlets exposes the target when not blanked by the beamlet blanker array,
wherein said apparatus comprises a manipulator device for manipulation of one or more charged particle beams of a plurality of charged particle beamlets in the charged particle multi-beamlet apparatus, wherein the manipulator device is provided as part of the projection lens system for providing a deflection and/or a focusing or defocusing of one or more of said one or more charged particle beamlets in the projection lens system, wherein the manipulator device is arranged at a side of the beam stop array facing away from the charged particle source, wherein the manipulator device comprises:
a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and
an electronic control circuit for providing control signals to the one or more electrodes of each through opening of the array of through openings,
wherein the method comprises the step of providing individual adjustment control for each through opening by providing the one or more electrodes of each individual through opening with an at least substantially analog adjustable voltage, wherein the charged particle multi-beamlet apparatus comprises a sensor for measuring at least one characteristic of said charged particle beamlets incident on said sensor, wherein the sensor is connected to said electronic control circuit, wherein the sensor is provided at a location where beamlets are directed to when blanked or at the location of the target during an exchange of a target which has been processed and a target to be processed, wherein the method comprises the step of, based on a feedback signal provided by the sensor to the electronic control circuit, providing said individual adjustment control for each through opening by setting each of the adjustable voltages to a value for obtaining the desired correction of each beamlet in order to provide corrected settings for the manipulator device to at least substantially correct for a deterioration and/or drift of one or more of the individual beamlets.

7. Charged particle multi-beamlet apparatus comprising an optical column which comprises:
a charge particle source for producing an expanding charged particle beam,
a collimator lens for collimating the charged particle beam,
an aperture array for creating multiple beamlets for exposing a target,
a beamlet blanker array for deflecting individual beamlets in a group of beamlets at certain times in order to blank them,
a beam stop array for stopping the deflected individual beamlets, and
a projection lens system for projecting the non-stopped beamlets onto a target,
wherein each of the multiple beamlets exposes the target when not blanked by the beamlet blanker array,
wherein the charged particle multi-beam maskless lithography device further comprises a manipulator device for manipulation of one or more charged particle beams of a plurality of charged particle beamlets in the charged particle multi-beamlet apparatus, wherein the manipulator device is arranged between the beamlet blanker array and the beam stop array, wherein the manipulator device comprises:
a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and
an electronic control circuit for providing control signals to the one or more electrodes of each through opening, wherein the electronic control circuit is arranged for providing the one or more electrodes of each individual through opening with an at least substantially analog adjustable voltage, wherein the charged particle multi-beamlet apparatus further comprises:
a sensor for measuring at least one characteristic of said charged particle beamlets incident on said sensor, wherein the sensor is connected to said electronic control circuit for providing individual adjustment control for each through opening based on a feedback signal provided by the sensor to the electronic control circuit wherein the sensor is provided at a location where beamlets are directed to when blanked or at the location of the target during an exchange of a target which has been processed and a target to be processed.

8. Charged particle multi-beamlet apparatus according to claim 7, wherein the voltage is individual adjustable for each electrode of said manipulator.

9. Charged particle multi-beamlet apparatus according to claim 7, wherein said manipulator device is arranged for focusing, deflection or stigmation of individual beamlets of said plurality of beamlets.

10. Charged particle multi-beamlet apparatus according to claim 7, wherein the planar substrate of said manipulator device is a wafer, and wherein the electronic control circuit comprises an integrated circuit on said planar substrate.

11. Charged particle multi-beamlet apparatus according to claim 7, wherein the electronic control circuit is, at least partially, arranged in-between two through openings on said manipulator device.

12. Charged particle multi-beamlet apparatus according to claim 11, wherein the electronic control circuit is arranged in non-beam areas between two through openings or between two groups of through openings on said manipulator device.

13. Charged particle multi-beamlet apparatus according to claim 7, wherein the electronic control circuit comprises a memory for storing control data for the one or more electrodes of one or more individual through openings, which memory is arranged on the planar substrate of said manipulator device and adjacent to said through openings.

14. Charged particle multi-beamlet apparatus according to claim 13, wherein the memory is arranged for storing control data for the one or more electrodes of one individual through opening, which memory is arranged on the planar substrate of said manipulator device and adjacent to said individual through opening.

15. Charged particle multi-beamlet apparatus according to claim 13, wherein the memory is arranged in-between two through openings.

16. Charged particle multi-beamlet apparatus according to claim 7, wherein the one or more electrodes of said manipulator device comprises a metal that is deposited on the planar substrate.

17. Charged particle multi-beamlet apparatus according to claim 16, wherein the metal comprises Molybdenum.

18. Charged particle multi-beamlet apparatus according to claim 16, wherein the one or more electrodes of a through opening in said manipulator device are at least partially arranged against an inwards facing wall of said through opening.

19. Charged particle multi-beamlet apparatus according to claim 18, wherein said one or more electrodes extend into the trough opening in a direction substantially parallel a centre line of said through opening.

20. Charged particle multi-beamlet apparatus according to claim 7, wherein the one or more electrodes of each through opening of said manipulator device are at least substantially surrounded by an earthed electrode, wherein the earthed electrode is arranged on said planar substrate, in the same plane as the one or more electrodes and surrounds the one or more electrodes at a distance.

21. Charged particle multi-beamlet apparatus according to claim 20, wherein the earthed electrode comprises a metal that is deposited on the planar substrate.

22. Charged particle multi-beamlet apparatus according to claim 21, wherein the metal comprises Molybdenum.

23. Charged particle multi-beamlet apparatus according to claim 20, wherein a surface of the one or more electrodes of said manipulator device that faces away from the planar substrate, is arranged at a height between the planar substrate and a surface of the earthed electrode that faces away from said planar substrate.

24. Charged particle multi-beamlet apparatus according to claim 23, wherein a thickness of the earthed electrode on the planar substrate of said manipulator device is larger than a thickness of the one or more electrodes on the planar substrate.

25. Charged particle multi-beamlet apparatus according to claim 7, wherein the electronic control circuit comprises connecting leads for connecting the electronic control circuit with the one or more electrodes of said manipulator device, wherein at least one of said connecting leads is at least partially arranged between two earthed electrically conducting layers.

26. Charged particle multi-beamlet apparatus according to claim 25, wherein the at least one of said connecting leads is at least partially arranged between two earthed leads.

27. Charged particle multi-beamlet apparatus according to claim 7, wherein the electronic control circuit comprises a demultiplexer for extracting control data for one or more individual through openings from a multiplexed signal, which demultiplexer is arranged on the planar substrate of said manipulator device and adjacent to said through openings.

28. Charged particle multi-beamlet apparatus according to claim 27, wherein the demultiplexer is arranged for extracting control data for the one or more electrodes of one individual through opening, which demultiplexer is arranged on the planar substrate of said manipulator device and adjacent to said individual through opening.

29. Charged particle multi-beamlet apparatus according to claim 27, wherein the demultiplexer is arranged in-between adjacent through openings.

30. Charged particle multi-beamlet apparatus according to claim 7, wherein the number of connecting leads to the manipulator device is smaller than the number of electrodes.

31. Charged particle multi-beamlet apparatus according to claim 7, wherein the number of connecting leads to a through opening of the manipulator device is smaller than the number of electrodes of said through opening.

32. The charged particle multi-beamlet apparatus according to claim 7,
wherein the manipulator device is a first manipulator device having a first planar substrate comprising a first array of through openings in the plane of the first planar substrate,
wherein the charged particle multi-beam apparatus comprises a second manipulator device having a second planar substrate comprising a second array of through openings in the plane of the second planar substrate, wherein each of the through openings comprises one or more electrodes arranged around the corresponding through opening, and wherein the one or more electrodes are arranged in and/or on said substrate,
wherein the second planar substrate is arranged at a distance and substantially parallel to the first planar substrate, wherein each through opening of the second array of through openings are at least substantially in line with a through opening of the first array of through openings.

33. Charged particle multi-beamlet apparatus according to claim 32, wherein the through openings of said second array of through openings have a radius r, and wherein the distance d between the first and second planar substrate is equal or smaller than the radius r.

34. Charged particle multi-beamlet apparatus according to claim 32, wherein the one or more electrodes of the first and second manipulator device are arranged on said first and second substrate, respectively, and wherein the one or more electrodes on the first substrate and the one or more electrodes on the second substrate face each other.

35. Charged particle multi-beamlet apparatus according to claim 32, wherein the second manipulator device is at least substantially mirror symmetrical to the first manipulator device, at least with respect to a centre plane between the first and second manipulator device.

36. A charged particle multi-beamlet maskless lithography device according to claim 7, wherein the sensor is arranged at a side of the beam stop array facing the beam blanker array.

37. Method according to claim 1, wherein the sensor is arranged at a side of the beam stop array facing the beam blanker array.

38. Method according to claim 37, wherein the sensor is arranged on the beam stop array at the location where the beamlets are directed by the beamlet blanker array when blanked.

39. Charged particle multi-beamlet maskless lithography device according to claim 36, wherein the sensor is arranged on the beam stop array at the location where the beamlets are directed by the beamlet blanker array when blanked.

40. A charged particle multi-beamlet maskless lithography device comprising an optical column which comprises:
   a charge particle source for producing an expanding charged particle beam,
   a collimator lens for collimating the charged particle beam,
   an aperture array for creating multiple beamlets for exposing a target,
   a beamlet blanker array for deflecting individual beamlets in a group of beamlets at certain times in order to blank them,
   a beam stop array for stopping the deflected individual beamlets, and
   a projection lens system for projecting the non-stopped beamlets onto a target,
   wherein each of the multiple beamlets exposes the target when not blanked by the beamlet blanker array,
   wherein the charged particle multi-beam maskless lithography device further comprises a manipulator device for manipulation of one or more charged particle beams of a plurality of charged particle beamlets in the charged particle multi-beamlet maskless lithography device, wherein the manipulator device comprises:
   a planar substrate comprising an array of through openings in the plane of the substrate, each of these through openings is arranged for passing at least one charged particle beamlet there through, wherein each of the through openings is provided with one or more electrodes arranged around the through opening, and wherein the one or more electrodes are arranged in and/or on said substrate, and
   an electronic control circuit for providing control signals to the one or more electrodes of each through opening, wherein the electronic control circuit is arranged for providing the one or more electrodes of each individual through opening with an at least substantially analog adjustable voltage, wherein the charged particle maskless multi-beamlet apparatus further comprises:
   a sensor for measuring at least one characteristic of said charged particle beamlets incident on said sensor, wherein the sensor is connected to said electronic control circuit for providing individual adjustment control for each through opening based on a feedback signal provided by the sensor to the electronic control circuit, wherein the sensor is provided at a location where beamlets are directed to when blanked or at the location of the target during an exchange of a target which has been processed and a target to be processed,
   wherein the manipulator device is provided as part of the projection lens system for providing a deflection and/or a focusing or defocusing of one or more of said one or more charged particle beamlets in the projection lens system, wherein the manipulator device is arranged at a side of the beam stop array facing away from the charged particle source.

* * * * *